(12) United States Patent
Tsai

(10) Patent No.: US 8,786,108 B2
(45) Date of Patent: Jul. 22, 2014

(54) PACKAGE STRUCTURE

(75) Inventor: Kun-Chen Tsai, Taoyuan (TW)

(73) Assignee: Unimicron Technology Corporation, Taoyuan (TW)

( * ) Notice: Subject to any disclaimer, the term of this patent is extended or adjusted under 35 U.S.C. 154(b) by 146 days.

(21) Appl. No.: 13/161,685

(22) Filed: Jun. 16, 2011

(65) Prior Publication Data

US 2012/0049363 A1 Mar. 1, 2012

(30) Foreign Application Priority Data

Sep. 1, 2010 (TW) ................................ 99129380 A

(51) Int. Cl.
*H01L 23/488* (2006.01)
(52) U.S. Cl.
USPC ........... 257/786; 257/678; 257/701; 257/702; 257/703; 257/738; 257/773; 257/774; 257/E23.023
(58) Field of Classification Search
USPC ........................................................ 257/738
See application file for complete search history.

(56) References Cited

U.S. PATENT DOCUMENTS

2005/0253245 A1* 11/2005 Lynch et al. .................. 257/698
2009/0108282 A1  4/2009 Matsuda et al.
2009/0201657 A1*  8/2009 Tanaka et al. ................ 361/783

FOREIGN PATENT DOCUMENTS

| CN | 1392598      | 1/2003  |
|----|--------------|---------|
| CN | 101515574    | 8/2009  |
| CN | 101887879    | 11/2010 |
| TW | 201003866 A  | 1/2010  |
| TW | 201026189 A  | 7/2010  |

* cited by examiner

*Primary Examiner* — Colleen Matthews
*Assistant Examiner* — William Harriston
(74) *Attorney, Agent, or Firm* — Edwards Wildman Palmer LLP; Peter F. Corless; Steven M. Jensen

(57) ABSTRACT

A package structure is provided, which includes a dielectric layer having opposing first and second surfaces, and through holes penetrating the surfaces; a strengthening layer formed on the first surface; a circuit layer formed on the second surface, and having wire bonding pads formed thereon and exposed from the through holes, and ball pads electrically connected to the wire bonding pads; a first solder mask layer formed on the first surface and the strengthening layer, and having first apertures formed therethrough for exposing the wire bonding pads; a second solder mask layer formed on the second surface and the circuit layer, and having second apertures formed therethrough for exposing the ball pads; and a semiconductor chip disposed on the first solder mask layer and electrically connected via conductive wires to the wire bonding pads exposed from the through holes. The strengthening layer ensures the steadiness of the chip to be mounted thereon without position shifting.

8 Claims, 3 Drawing Sheets

PACKAGE STRUCTURE

CROSS-REFERENCES TO RELATED APPLICATIONS

This application claims under 35 U.S.C. §119(a) the benefit of Taiwanese Application No. 99129380, filed Sep. 1, 2010, the entire contents of which is incorporated herein by reference.

BACKGROUND OF THE INVENTION

1. Field of the Invention

This invention relates to package structures, and, more particularly, to a package structure having a semiconductor chip.

2. Description of Related Art

In the evolution of semiconductor package techniques, in addition to traditional wire bonding and flip-chip techniques, semiconductor device industry has developed a variety of package structures nowadays. For instance, embedding a chip directly in a package substrate may reduce the whole volume of the package structure, enhance electricity capability, and provide flexibility for adapting to various package types. Referring to FIGS. 1A through 1D, a method of fabricating a package structure according to the prior art is shown. As shown in FIG. 1A, a copper substrate 10 that has a first surface 10a and an opposing second surface 10b is provided. A patterned photoresist layer 110 and a resistance layer 111 are formed on the first surface 10a and the second surface 10b, respectively. Next, the substrate 10 is etched to form a disposing trough 12a and a plurality of troughs 12b. As shown in FIG. 1B, a first metal layer 120a is plated on walls of the disposing trough 12a, a second metal layer 120b is plated on walls of the troughs 12b, and then the patterned photoresist layer 110 and the resistance layer 111 are removed. As shown in FIG. 1C, a glue layer 15 is coated on the first metal layer 120a for a semiconductor chip 13 to be disposed thereon. The semiconductor chip 13 has a plurality of electrode pads 130 for electrically connecting to the second metal layer 120b via conductive wires 14. Next, an encapsulant 17 is formed on the copper substrate 10 for encapsulating the semiconductor chip 13 and the conductive wires 14. As shown in FIG. 1D, the copper substrate 10 is removed to expose the first metal layer 120a and the second metal layer 120b. The second metal layer 120b is used as raised connection points 16. The electrode pads 130 on the semiconductor chip 13 are used to externally connect to a printed circuit board via the conductive wires 14 and the raised connection points 16.

However, in the prior art, the disposing trough 12a and the trough 12b are fabricated during an etching process. As a result, the disposing trough 12a and the trough 12b have uneven bottoms, thereby causing unsteadiness and shifting problems to the semiconductor chip 13 while being disposed in the disposing trough 12a. Also, the package body has no strengthened construction formed, and is thus easily deformed due to an external force.

Furthermore, in the etching process of removing the copper substrate 10, more etching time is required due to the thickness difference between the disposing trough 12a and the raised connection points 16, thereby easily causing damages on the first metal layer 120a and the second metal layer 120b.

Hence, it is a highly urgent technique issue in the industry to provide a package structure capable of avoiding the abovementioned drawbacks of the prior art.

SUMMARY OF THE INVENTION

In view of the drawbacks of the prior art mentioned above, it is therefore an objective of this invention to provide a package structure, which ensures steadiness of its semiconductor chip without position shifting, and also provides the package structure with certain strength from getting deformed easily.

It is a further objective of the present invention to provide a package structure, which prevents its wire bonding pads from being damaged in the fabrication process.

To achieve the aforementioned and other objectives, the present invention provides a package structure, which comprises: a dielectric layer, which has a first surface, a second surface opposing the first surface, and a plurality of through holes passing through the first and the second surfaces; a strengthening layer, which is formed on the first surface of the dielectric layer; a circuit layer, which is formed on the second surface of the dielectric layer, and has a plurality of wire bonding pads exposed from the through holes and a plurality of ball pads electrically connected to the wire bonding pads; a first solder mask layer, which is formed on the first surface of the dielectric layer and the strengthening layer, and is formed with a plurality of first apertures for exposing the wire bonding pads; a second solder mask layer, which is formed on the second surface of the dielectric layer and the circuit layer, and forms a plurality of second apertures for exposing the ball pads; and a semiconductor chip, which is disposed on the first solder mask layer, and is electrically connected via conductive wires to the wire bonding pads exposed from the through holes.

In an embodiment of the present invention, the semiconductor chip has an active surface and an opposing inactive surface, the active surface has a plurality of electrode pads electrically connecting to each of the conductive wires, and the inactive surface is bonded to the first solder mask layer.

In an embodiment of the present invention, the package structure further comprises a surface treatment layer formed on the wire bonding pads and the ball pads, and the surface treatment layer is formed by using freedom electroplating nickel/gold, chemical plating nickel/gold, Electroless Nickel Immersion Gold (ENIG), Electroless Nickel Electroless Palladium Immersion Gold (ENEPIG), Immersion Tin, or Organic Solderability Preservative (OSP).

In an embodiment of the present invention, the package structure further comprises a plurality of solder balls implanted on the ball pads of the second apertures.

In an embodiment of the present invention, the package structure further comprises an encapsulant formed on the first solder mask layer and inside the first apertures and the through holes, for encapsulating the semiconductor chip, the conductive wires, and the wire bonding pads.

In view of the above, according to the package structure of the present invention, surface of the strengthening layer is not damaged. Therefore, the first solder mask layer formed thereon also maintains even. Compared with the prior art, when the semiconductor chip is disposed on the first solder mask layer, the semiconductor chip in the present invention can maintain its steadiness without occurrence of position shifting. Furthermore, since the etching process of fabricating the through holes does not take a long time, the wire bonding pads and ball pads will not be damaged after apertures are formed, thereby enhancing electricity connection quality.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The following illustrative embodiments are provided to illustrate the disclosure of the present invention; those in the art can apparently understand these and other advantages and effects after reading the disclosure of this specification. The present invention can also be performed or applied by other different embodiments. The details of the specification may be on the basis of different points and applications, and numerous modifications and variations can be devised without departing from the spirit of the present invention.

Referring to FIGS. 2A through 2E, sectional diagrams for depicting a method of fabricating a package structure 2 of an embodiment according to the present invention are shown.

Figure 1A:
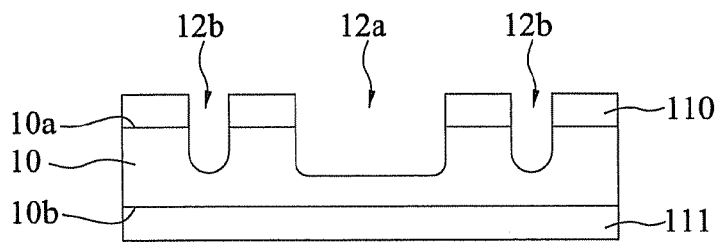
FIGS. 1A through 1D are sectional diagrams depicting a method of fabricating a package structure according to the prior art.
Figure 1B:
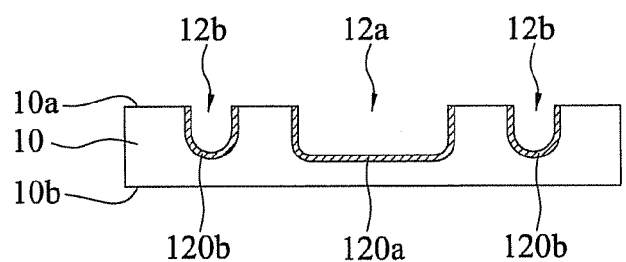
Figure 1C:
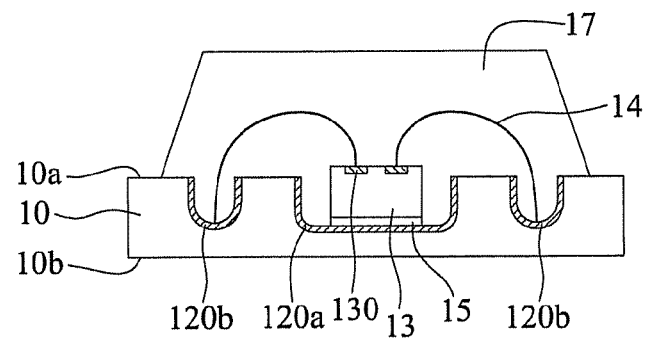
Figure 1D:
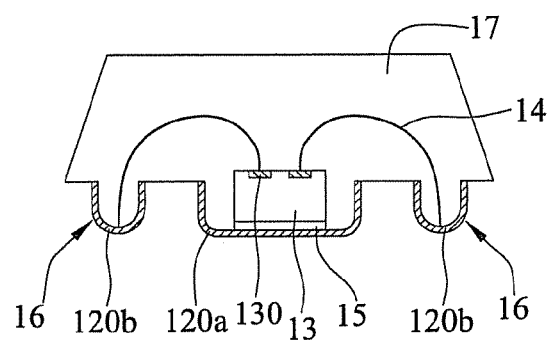
Figure 2A:
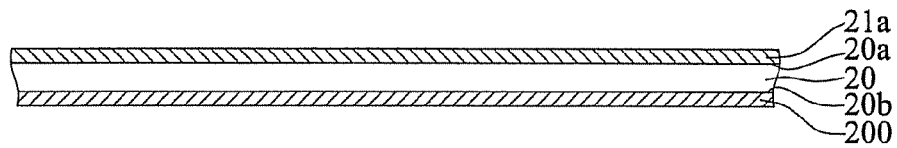
FIGS. 2A through 2E are sectional diagrams depicting a method of fabricating a package structure according to the present invention.

As shown in FIG. 2A, a dielectric layer 20 that has a first surface 20a and an opposing second surface 20b is provided. A strengthening layer 21a and a metal layer 200 are formed on the first surface 20a and second surface 20b, respectively. In an embodiment of the present invention, the strengthening layer 21a is made of a metal such as copper.

Figure 2B:
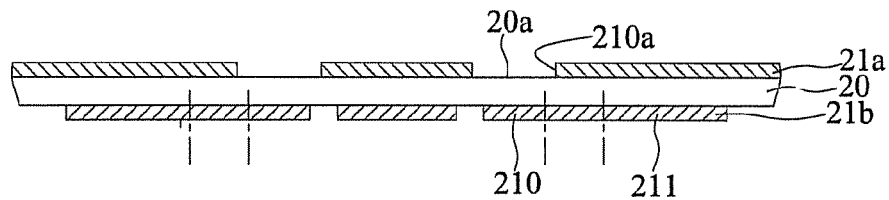

As shown in FIG. 2B, the metal layer 200 is patterned such that a circuit layer 21b is formed on the metal layer 200. The circuit layer 21b has a plurality of wire bonding pads 210 and ball pads 211 electrically connected to the wire bonding pads 210. A plurality of openings 210a are formed through the strengthening layer 21a corresponding in position to the wire bonding pads 210, to expose a part of the first surface 20a of the dielectric layer 20.

Figure 2C:
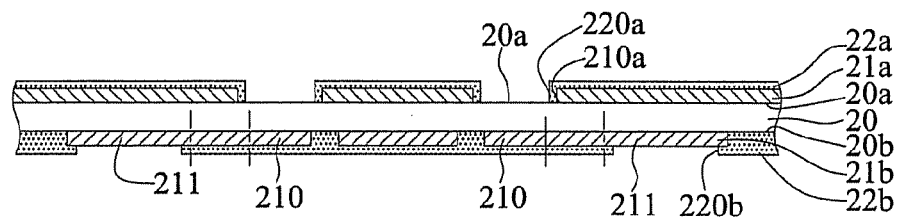

As shown in FIG. 2C, a first solder mask layer 22a is formed on the first surface 20a of the dielectric layer 20 and the strengthening layer 21a; a second solder mask layer 22b is formed on the second surface 20b of the dielectric layer 20 and the circuit layer 21b; and a plurality of first apertures 220a are formed through the first solder mask layer 22a corresponding in position to and being less in area than each of the openings 210a, so as to expose a part of the first surface 20a of the dielectric layer 20. Also, a plurality of second apertures 220b are formed through the second solder mask layer 22b, to expose the ball pads 211.

Figure 2D:
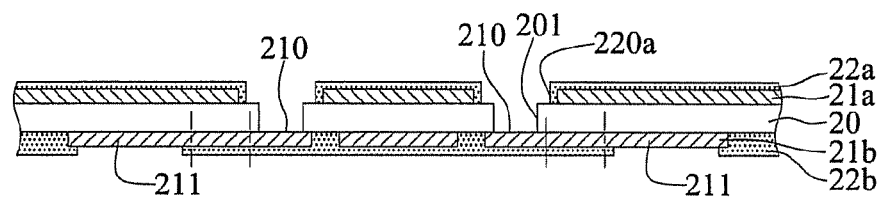

As shown in FIG. 2D, a through hole 201 is formed in each of the first apertures 220a that passes through the dielectric layer 20, in order to expose each of the wire bonding pads 210.

Figure 2E:
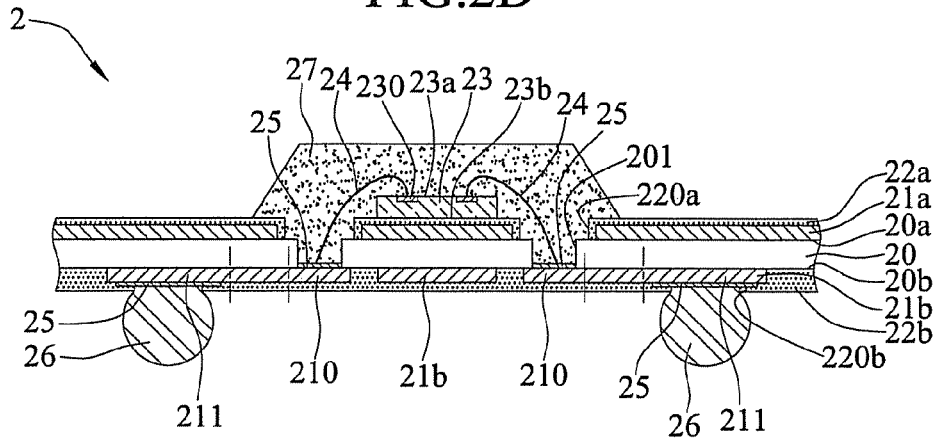
Figure 3A:
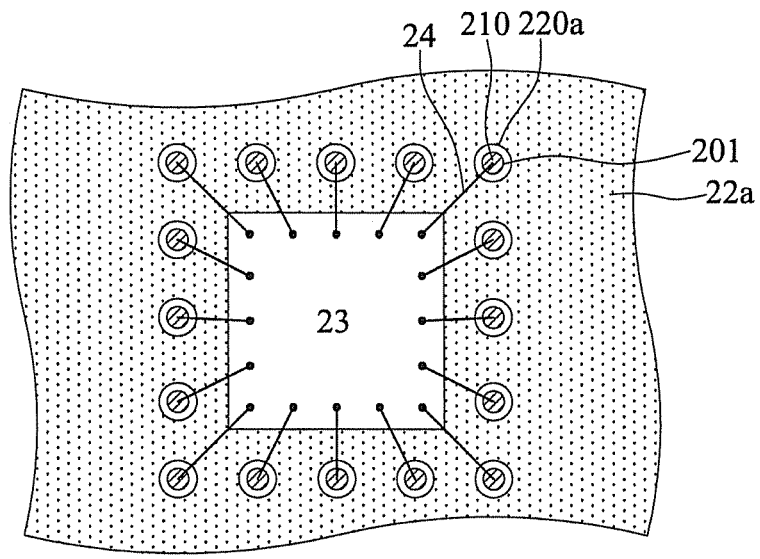
FIG. 3A is a top-view diagram depicting a package structure according to the present invention before an encapsulant is formed.
Figure 3B:
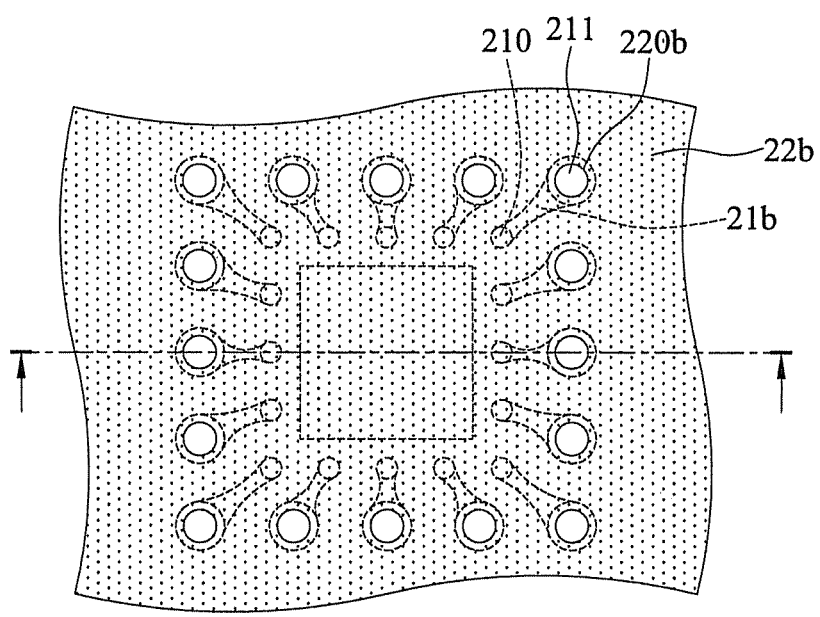
FIG. 3B is a bottom-view diagram depicting a package structure according to the present invention before an encapsulant is formed.

As shown in FIG. 2E, a semiconductor chip 23 is disposed on the first solder mask layer 22a and is electrically connected to the wire bonding pads 210 via conductive wires 24. Also, an encapsulant 27 is formed on the first solder mask layer 22a and inside the first apertures 220a and the through holes 201, to encapsulate the semiconductor chip 23, the conductive wires 24 and the wire bonding pads 210. Solder balls 26 are then implanted on the ball pads 211 inside the second apertures 220b, for providing electrical connection to an external printed circuit board.

However, before the conductive wires 24 and the solder balls 26 are formed and implanted, a surface treatment layer 25 may be formed on the wire bonding pads 210 and the ball pads 211. In an embodiment of the present invention, the surface treatment layer 25 is formed by using freedom electroplating nickel/gold, chemical plating nickel/gold, Electroless Nickel Immersion Gold (ENIG), Electroless Nickel Electroless Palladium Immersion Gold (ENEPIG), Immersion Tin, or Organic Solderability Preservative (OSP).

According to the package structure 2 of the present invention, surface of the strengthening layer 21a is intact except the openings 210a. Therefore, the first solder mask layer 22a formed on the strengthening layer 21a is even. As a result, when the semiconductor chip 23 is disposed on the first solder mask layer 22a, the unsteadiness and position shifting problems as in the prior art are avoidable.

Furthermore, the through holes 201 simply penetrate through the dielectric layer 20 without damaging the surfaces of the wire bonding pads. Therefore, the surfaces of the wire bonding pads are also intact. Also, the thickness of the dielectric layer 20 is even, and the etching process of the through holes does not need long time, thereby avoiding damage problem happened to external connection points of the metal layer in the prior art.

In view of the above, the package structure according to the present invention comprises a dielectric layer 20 having a first surface 20a and an opposing second surface 20b, a strengthening layer 21a formed on the first surface 20a of the dielectric layer 20, a circuit layer 21b formed on the second surface 20b of the dielectric layer 20, a first solder mask layer 22a formed on the first surface 20a of the dielectric layer 20 and the strengthening layer 21a, a second solder mask layer 22b formed on the second surface 20b of the dielectric layer 20 and the circuit layer 21b, and a semiconductor chip 23 disposed on the first solder mask layer 22a.

The dielectric layer 20 has a plurality of through holes 201 passing through the first surface 20a and second surface 20b.

The strengthening layer 21a supports and strengthens the overall structure.

The circuit layer 21b has a plurality of wire bonding pads exposed from the through holes 201 and a plurality of ball pads 211 electrically connected to the wire bonding pads 210.

The first solder mask layer 22a is formed with a plurality of first apertures 220a corresponding in position to the through holes 201 to expose the wire bonding pads 211 from the first apertures 220a.

The second solder mask layer 22b is formed with a plurality of second apertures 220b to expose the ball pads 211 from the second apertures 220b.

The semiconductor chip 23 has an active surface 23a and an opposing inactive surface 23b. The active surface 23a has a plurality of electrode pads 230 for electrically connecting via conductive wires 24 to the wire bonding pads that are exposed from the through holes, and the inactive surface 23b is bonded to the first solder mask layer 22a.

The package structure 2 further comprises a surface treatment layer 25 formed on the wire bonding pads 210 and the ball pads 211. In an embodiment of the present invention, the surface treatment layer 25 is formed by using freedom electroplating nickel/gold, chemical plating nickel/gold, Electroless Nickel Immersion Gold (ENIG), Electroless Nickel Electroless Palladium Immersion Gold (ENEPIG), Immersion Tin, or Organic Solderability Preservative (OSP).

The package structure 2 further comprises a plurality of solder balls 26 implanted on the ball pads 211 inside the second apertures 220b.

The package structure 2 further comprises an encapsulant 27 formed on the first solder mask layer 22a and inside the first apertures 220a and the through holes 201 for encapsulating the semiconductor chip 23, the conductive wires 24, and the wire bonding pads 210.

In summary, according to the present invention, the strengthened layer surface of the package structure is intact. Therefore, the first solder mask layer formed thereon is even. As a result, when the semiconductor chip is disposed on the first solder mask layer, the semiconductor chip is steady and without position shifting, thereby providing advantage for bonding the conductive wires and enhancing electrical connection quality.

Furthermore, since surfaces of the wire bonding pads are not damaged while forming the through holes, surfaces of the wire bonding pads are also kept even. Also, the etching process of fabricating the through holes does not need long time, thereby avoiding damage on the wire bonding pads, and thus providing better electrical conduction and enhancing electrical connection quality.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A package structure, comprising:
    a dielectric layer having a first surface, a second surface opposing the first surface, and a plurality of through holes passing through the first and the second surfaces;
    a strengthening layer formed on the first surface of the dielectric layer;
    a circuit layer formed on the second surface of the dielectric layer and having a plurality of wire bonding pads exposed in the through holes and a plurality of ball pads electrically connected to the wire bonding pads;
    a first solder mask layer formed on the first surface of the dielectric layer and the strengthening layer and having a plurality of first apertures corresponding to the through holes for exposing the wire bonding pads, wherein the strengthening layer is formed between the first surface of the dielectric layer and the first solder mask layer;
    a second solder mask layer disposed on the second surface of the dielectric layer and the circuit layer and having a plurality of second apertures formed therethrough for exposing the ball pads; and
    a semiconductor chip disposed on the first solder mask layer, and electrically connected via conductive wires to the wire bonding pads exposed from the through holes.

2. The package structure of claim 1, further comprising an encapsulant disposed on the first solder mask layer and inside the first apertures and the through holes, for encapsulating the semiconductor chip, the conductive wires, and the wire bonding pads.

3. The package structure of claim 1, wherein the semiconductor chip has an inactive surface bonded to the first solder mask layer, and an active surface opposing the inactive surface and having a plurality of electrode pads electrically connected to the conductive wires.

4. The package structure of claim 1, further comprising a surface treatment layer formed on the wire bonding pads and ball pads.

5. The package structure of claim 4, further comprising an encapsulant formed on the first solder mask layer and inside the first apertures and the through holes, for encapsulating the semiconductor chip, the conductive wires, and the wire bonding pads.

6. The package structure of claim 4, wherein the surface treatment layer is made of freedom electroplating nickel/gold, chemical plating nickel/gold, Electroless Nickel Immersion Gold (ENIG), Electroless Nickel Electroless Palladium Immersion Gold (ENEPIG), Immersion Tin, or Organic Solderability Preservative (OSP).

7. The package structure of claim 1, further comprising a plurality of solder balls implanted on the ball pads in the second apertures.

8. The package structure of claim 7, further comprising an encapsulant formed on the first solder mask layer and inside the first apertures and the through holes, for encapsulating the semiconductor chip, the conductive wires, and the wire bonding pads.

* * * * *